United States Patent
Lindolf et al.

(10) Patent No.: US 6,917,208 B2
(45) Date of Patent: Jul. 12, 2005

(54) METHOD AND TEST STRUCTURE FOR DETERMINING RESISTANCES AT A PLURALITY OF INTERCONNECTED RESISTORS IN AN INTEGRATED CIRCUIT

(75) Inventors: Jürgen Lindolf, Friedburg (DE); Sibina Sukman, München (DE)

(73) Assignee: Infineon Technologies AG, Munich (DE)

( * ) Notice: Subject to any disclaimer, the term of this patent is extended or adjusted under 35 U.S.C. 154(b) by 19 days.

(21) Appl. No.: 10/407,714

(22) Filed: Apr. 4, 2003

(65) Prior Publication Data

US 2003/0189436 A1 Oct. 9, 2003

(30) Foreign Application Priority Data

Apr. 4, 2002 (DE) .......................................... 102 14 885

(51) Int. Cl.$^7$ ........................ G01R 27/08; G01R 31/26; G01R 31/02
(52) U.S. Cl. ........................ 324/715; 324/765; 324/763
(58) Field of Search ................................. 324/715, 765, 324/763; 438/17, 18

(56) References Cited

U.S. PATENT DOCUMENTS

| | | | |
|---|---|---|---|
| 4,347,479 A | * | 8/1982 | Cullet ........................ 324/716 |
| 4,651,086 A | * | 3/1987 | Domenichini et al. ...... 324/715 |
| 5,140,276 A | * | 8/1992 | Fisher ........................ 324/713 |
| 5,457,402 A | * | 10/1995 | Sato ............................ 324/772 |
| 5,627,101 A | * | 5/1997 | Lin et al. ....................... 438/18 |

FOREIGN PATENT DOCUMENTS

| | | |
|---|---|---|
| DE | 36 15 550 A1 | 11/1987 |
| DE | 100 12 313 A1 | 9/2001 |

* cited by examiner

*Primary Examiner*—Anjan K. Deb
(74) *Attorney, Agent, or Firm*—Laurence A. Greenberg; Werner H. Stemer; Ralph E. Locher

(57) ABSTRACT

A method for determining resistances at a plurality of interconnected resistors in an integrated circuit and a resistor configuration in which the resistors are interconnected to form a ring structure. Two measurement pads are in each case provided at the nodes between two resistors. The measurement pads can be used for feeding in current and for measuring voltage according to the known four-point measurement method. The effect of the ring structure is that fewer measurement pads are required, in contrast to the customary series circuit of resistors. By way of example, in the case of a ring structure with four resistors, two measurement pads are advantageously saved. The consequently reduced chip area required for the ring structure is advantageous particularly in the case of test circuits, which can be arranged for example in the narrow sawing frame between two chips.

4 Claims, 2 Drawing Sheets

METHOD AND TEST STRUCTURE FOR DETERMINING RESISTANCES AT A PLURALITY OF INTERCONNECTED RESISTORS IN AN INTEGRATED CIRCUIT

BACKGROUND OF THE INVENTION

Field of the Invention

The invention relates to a method and a test structure for determining a plurality of interconnected resistors formed as an integrated circuit. For the purpose of enabling a four-point measurement, the resistors have measurement pads via which they can be supplied and measured.

In the fabrication of integrated circuits disposed as chips in rows and columns on a wafer, it has already been known to provide test structures at which various process parameters can be checked and monitored. The test structures include, for example, electronic components such as transistors, resistors or the like, at which the various process parameters can be checked at least in randomly sampled fashion. Such test structures are necessary since the integrated circuits are generally constructed with such complexity that the process parameters cannot be tested at the circuits themselves.

In this connection, it is known, moreover, to test resistors arranged in the form of series resistors. In this case, low-value resistors, in particular, are connected by means of measurement pads which allow a Kelvin contact-connection according to the four-point measurement method. In this measurement method, each resistor respectively requires two measurement pads for each connection. Since, in the development of integrated circuits, it is always endeavored to make the circuits as small as possible for technological and economical reasons, the high number of measurement pads is disadvantageous since these pads require a comparatively large amount of space. In particular, the arrangement of the test circuits in the sawing frame (kerf) between the chips is difficult since the latter is very narrow. However, even with an arrangement on a test chip, the available chip area on the wafer is occupied in an unfavorable manner.

German published patent applications DE 36 15 550 A1 and DE 100 12 313 A1 have previously described resistance measuring arrangements in which a ring-type arrangement of resistors is provided.

SUMMARY OF THE INVENTION

It is accordingly an object of the invention to provide a method and a testing structure for determining the resistance values of several interconnected resistors in an integrated circuit, which overcomes the above-mentioned disadvantages of the heretofore-known devices and methods of this general type and which further reduces the area requirement of test structures.

With the foregoing and other objects in view there is provided, in accordance with the invention, a method for determining resistances in a test structure for integrated circuits with a four-point measurement, wherein at least four resistors are interconnected and the resistors have measurement pads for impressing a measurement current and for measuring a voltage drop. The method comprises the following steps:

providing a plurality of resistors interconnected in a ring structure with each two resistors connected to one another via a node, and with each of four nodes having two measurement pads for impressing current and measuring a voltage;

in a first measurement step, impressing a first measurement current via one measurement pad at a first node, the current being divided between two mutually parallel resistor branches each having at least two series-connected resistors, measuring first, second and third voltages at a second measurement pad of the first node and a respective measurement pad of the two nodes adjacent the first node, while the measurement pads of a remaining node serve as a zero point;

in a second measurement step, impressing a second measurement current via one measurement pad at a second node, the current being divided between two mutually parallel resistor branches each having at least two series-connected resistors, measuring fourth, fifth and sixth voltages at a second measurement pad of the second node and a respective measurement pad of the two nodes adjacent the second node, while the measurement pads of a remaining node serve as a zero point; and determining the resistances of the four resistors from the measured voltages and from the measurement currents.

With the above and other objects in view there is also provided, in accordance with the invention, a test structure for integrated circuits for determining resistances of at least four interconnected resistors with a four-point measurement, comprising:

a plurality of measurement pads respectively connected to the resistors for impressing measurement current and measuring a voltage drop;

a ring structure interconnecting the resistors, said ring structure forming at least two mutually parallel resistor branches, each said resistor branch having at least two resistors connected in series;

a plurality of nodes each connecting two resistors to one another, and each node of said plurality of nodes having two measurement pads for impressing a current and for measuring a voltage.

The method according to the invention for determining resistances of a plurality of interconnected resistors and the test structure according to the invention are distinguished by the fact that the resistors are arranged in a ring structure. In this case, it is regarded as particularly advantageous that although four measurements pads are likewise required for each resistor, overall measurement pads can be saved through multiple utilization of the measurement pads. As a result, the chip area set free can advantageously be saved or utilized for other test structures. Thus, by way of example, in the case of an arrangement of four resistors in the ring structure, two of ten measurement pads that are otherwise necessary can be saved.

The ring structure has at least two resistor branches connected in parallel. This affords two separate current paths which yield two linear equations for the determination of the resistances, so that the calculation of the resistors is relatively simple.

At least two resistors are to be connected in series in each resistor branch. This results in further nodes into which a measurement current can be fed. Consequently, two further linear equations are obtained, so that the four unknown resistances can easily be solved using the total of four linear equations.

The resistances are determined by measuring the voltage drops across the resistors in dependence on the flowing current. These measurements can easily be carried out by the four-point method.

In this case, the individual resistances are determined, in principle, according to Ohm's law, which is known per se, it also being possible to take account of the linkages of the resistors.

One advantageous solution is also seen in using the resistors as test structures of semiconductor circuits. In this way, by way of example, resistors formed by interconnects can easily be checked with regard to their desired values.

Since the resistors may, in particular, also be arranged on a test structure, the available chip area can be optimally utilized here.

One advantageous solution also consists in arranging the resistors as test structures in the sawing frame, the so-called kerf, between two chips. Since, by its nature, this area is very narrow, the arrangement of the resistors with a reduced number of measurement pads appears particularly suitable.

Use is advantageous in memory circuits such as DRAMs, where the packing density is particularly high in order to obtain the highest possible storage capacity. The test structures should therefore be of especially space-saving design.

Other features which are considered as characteristic for the invention are set forth in the appended claims.

Although the invention is illustrated and described herein as embodied in a method and test structure for determining resistances at a plurality of interconnected resistors in an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
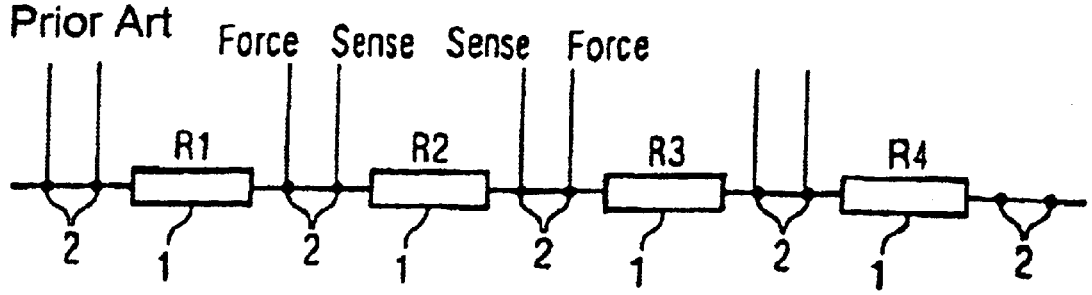
FIG. 1 is a diagram of a prior art integrated resistor configuration with a series circuit.

Referring now to the figures of the drawing in detail and first, particularly, to FIG. 1 thereof, the concept underlying the invention will be more readily understood with reference to a prior art integrated resistor configuration with a series circuit of four resistors 1, for example, as it has been measured hitherto. Kelvin's four-point measurement method is generally employed particularly in the case of small resistances, as may be realized in the form of interconnects.

This method has the advantage of practically eliminating for example resistances on leads or contact resistances at the contact-connection points (measurement pads 2) at which the test probes of a test board are placed. This measurement method is based on impressing the measurement current at separate measurement pads 2 (force line) and measuring the voltage at further measurement pads 2, the so-called sense lines. This makes it possible to avoid for example the voltage drop on the force line and also the contact resistance between the force measurement probe and the measurement pad 2. The contact resistance between the sense line and the measurement pad 2 including the line resistance thereof is negligible, by contrast, since the measurement circuit is made with very high resistance and a very much lower measurement current flows here in comparison with the current on the force line. The voltage drop measured across the resistor 1 can be detected very precisely and therefore corresponds exactly to the actual resistance which can be determined according to Ohm's law R=U/I, if the impressed current I is known.

It is disadvantageous, however, that, in that configuration, two measurement pads 2 are required for each resistor connection, as can be gathered from FIG. 1. Consequently, in this example, the four resistors R1, R2, R3 and R4 require ten measurement pads 2 onto which the test probes (force and sense, respectively) can be placed. Generally, the area requirement for n resistors is (n+1)·2 measurement pads for the series configuration of resistors.

For reasons of clarity, only the probe arrangement for the resistor R2 has been illustrated in greater detail in FIG. 1. The same applies correspondingly to the remaining resistors R1, R3 and R4.

Figure 2:
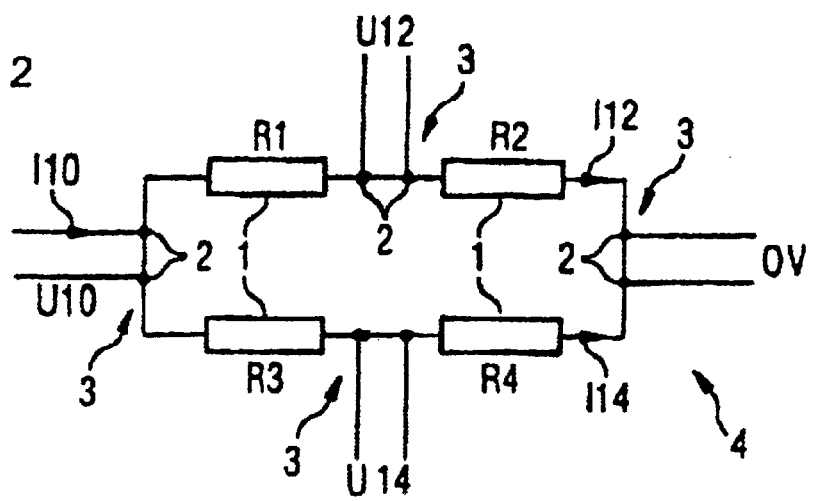
FIG. 2 is a diagram of an exemplary embodiment of the invention with a first measurement configuration.
Figure 3:
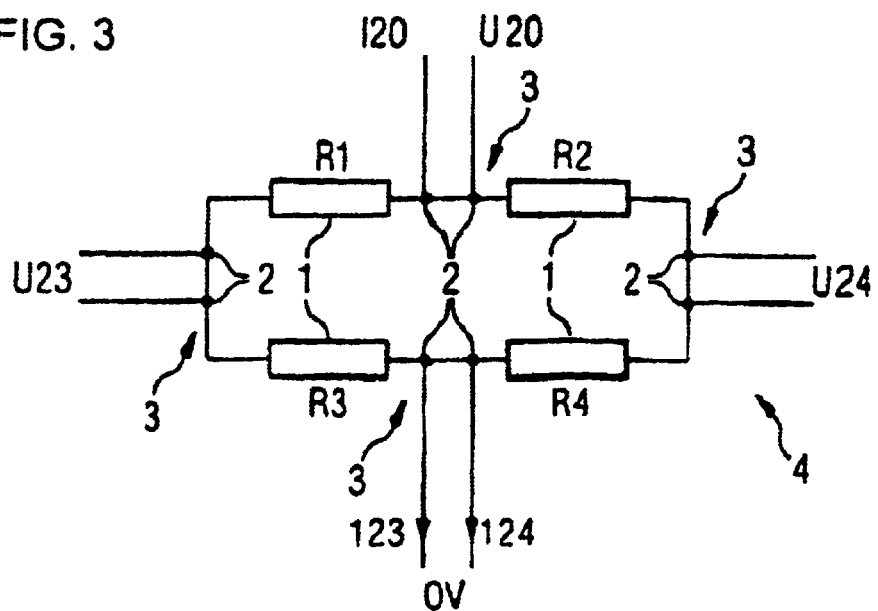
FIG. 3 is a diagram of the exemplary embodiment with a second measurement configuration.

In the exemplary embodiment according to the invention as shown in FIGS. 2 and 3, by contrast, at least two measurement pads 2 are saved. Generally, only n·2 measurement pads are required here. As can be gathered from FIG. 2, the four resistors R1, R2, R3 and R4 are arranged in a ring structure. Two current paths I12 and I14 have been formed from in each case two resistor pairs R1 and R2, and R3 and R4, respectively. Each current path I12 or I14 has two series-connected resistors R1, R2 or R3, R4, respectively. In order to be able to employ the Kelvin measurement method, it is also the case here that two measurement pads 2 are arranged at each node 3 produced between two resistors 1.

The method of operation of this configuration is explained in more detail below. Firstly, in a first measurement step, the measurement current I10 is applied to the left-hand node 3 of FIG. 2 via a force line, the measurement current being divided into the two current paths I12 and I14. The right-hand node 3 shall be assumed to be the 0 point (0V) or ground. Now—in each case measured with respect to ground at the right-hand node 3 of FIG. 2—the voltages U10, U12 and U14 can be measured via sense lines at separate measurement pads 2. In the case of the two measurement pads 2 for the voltage tap U12 and U14, only one measurement pad 2 is required in this measurement step. The second measurement pad 2 initially remains unused.

The following equations for the unknown resistors R1 to R4 result from this according to Ohm's law and the linkages present.

$$I10=I12+I14=U10/(R1+R2)+U10/(R3+R4).$$

On the other hand, the following holds true:

$$I12=(U10-U12)/R1 \text{ and } I12=U12/R2 \qquad (1)$$

The following correspondingly holds true:

$$I14=(U10-U14)/R3 \text{ and } I14=U14/R4 \qquad (1)$$

Replacing the two currents I12 and I14 in accordance with (1) yields $$R2=U12*R1/(U10-U12) \text{ and} \qquad (2)$$

$$R4=U14*R3/(U10-U14) \qquad (2)$$

It can be seen from these two equations (2) that the resistors R1 to R4 depend only on the measured voltages U10, U12 and U14 and the resistors R1, R3, and no longer on the impressed current I10.

A second measurement step is illustrated in FIG. 3. FIG. 3 shows the same ring structure 4 as FIG. 2. However, in FIG. 3, a current I20 is now impressed at a further node (the top middle node 3) of the ring structure 4. The current flows to the bottom middle node 3, which now represents the reference point 0V. The currents I23 and I24 now flow through the resistor branches R1+R3 and R2+R4, respectively, so that, in addition to the voltage U20, the voltages U23 and U24 can also be measured with respect to 0V.

In this measurement step, both measurement pads 2 are used for feeding in the current I20 and measuring the voltage U20. At the two outer nodes 3, by contrast, only one measurement pad 2 is required for the voltage measurements.

In a manner similar to that for FIG. 2, the following equations can now also be established for the circuit diagram of FIG. 3.

$$I20=I23+I24=U20/(R1+R3)+U20/(R2+R4) \quad (3)$$

The following holds true $$I23=(U20-U23)/R1 \text{ and } I23=U23/R3 \quad (3)$$

The following results from equations (2) and (3):

$$I20=(U20-U23)/R1+(U20-U24)*(U10-U12)/(R1*U12)$$

It follows from this that:

$$R1=(U20-U23)/I20+(U20-U24)*(U10-U12))/(I20*U12) \quad (4)$$

and the following results analogously thereto:

$$R3=U23/I20+(U24)*(U10-U14)/(I20*U14) \quad (5)$$

Equations (4) and (5) contain the measured voltages U20, U23, U24, U10, U12, U14 and the current I20 for the calculation of the resistors R1 and R3. As a result, it is possible firstly to calculate these two resistors R1 and R3. Insertion into the two formulae (2) also yields the resistances for the two resistors R2 and R4.

Although the configuration of the resistors 1 in a ring structure 4 requires somewhat more measurement and computation outlay than in the case of a series arrangement of resistors 1, this extra outlay is certainly justified by comparison with the extra outlay for more measurement pads 2 since the measurement and calculation can be automated in a cost-effective manner.

It will be readily understood to those of skill in the pertinent art that the ring structure 4 can, in principle, also be formed with further resistors 1. The determination of the individual resistors 1 is then to be adapted accordingly.

Figure 4:
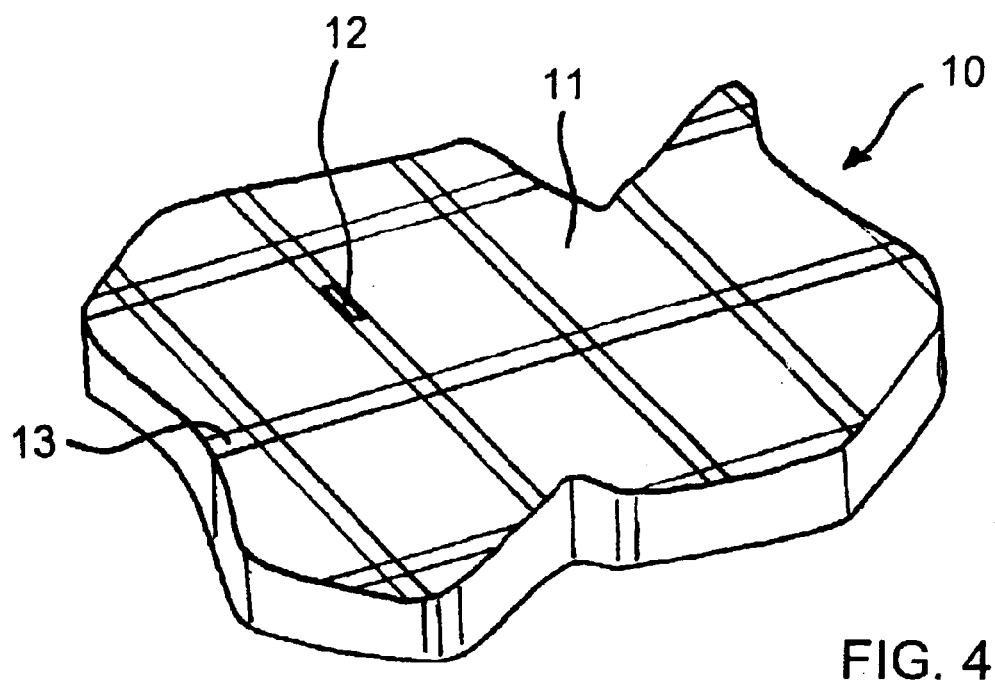
FIG. 4 is a partial perspective view of a semiconductor wafer with a test structure according to the invention.

The novel method and configuration result in a reduced chip area required for the ring structure. This is particularly advantageous in the case of test circuits, which can be arranged for example in the narrow sawing frame (kerf) between the chips. FIG. 4 is a highly stylized perspective view showing a portion of a wafer 10 with a matrix of semiconductor chips 11, e.g., DRAM chips. A test structure 12 is shown in the kerf or sawing frame 13 between two chips 11.

We claim:

1. A method for determining resistances in a test structure for integrated circuits with a four-point measurement, wherein at least four resistors are interconnected and the resistors have measurement pads for impressing a measurement current and for measuring a voltage drop, the method which comprises:

providing a plurality of resistors, interconnected in a ring structure with each two resistors connected to one another via a node, and with each of four nodes having two measurement pads for impressing current and measuring a voltage;

in a first measurement step, impressing a first measurement current via one measurement pad at a first node, the current being divided between two mutually parallel resistor branches each having at least two series-connected resistors, measuring first, second and third voltages at a second measurement pad of the first node and a respective measurement pad of the two nodes adjacent the first node, while the measurement pads of a remaining node serve as a zero point;

in a second measurement step, impressing a second measurement current via one measurement pad at a second node, the current being divided between two mutually parallel resistor branches each having at least two series-connected resistors, measuring fourth, fifth and sixth voltages at a second measurement pad of the second node and a respective measurement pad of the two nodes adjacent the second node, while the measurement pads of a remaining node serve as a zero point; and determining the resistances of the four resistors from the measured voltages and from the measurement currents.

2. A test structure for integrated circuits for determining resistances of at least four interconnected resistors with a four-point measurement, comprising:

a plurality of measurement pads respectively connected to the resistors for impressing measurement current and measuring a voltage drop;

a ring structure interconnecting the resistors, said ring structure forming at least two mutually parallel resistor branches, each said resistor branch having at least two resistors connected in series, each two interconnected resistors of said ring structure being connected at a node, each said node having two measurement pads for impressing a current and for measuring a voltage.

3. The test structure according to claim 2 disposed on a wafer in a kerf between two integrated memory circuits.

4. The test structure according to claim 2 disposed on a wafer in a kerf between two DRAM memory circuits.

* * * * *